United States Patent
Liang et al.

(10) Patent No.: US 8,067,781 B2
(45) Date of Patent: Nov. 29, 2011

(54) LIGHT EMITTING STRUCTURE AND SECURING DEVICE THEREOF

(75) Inventors: Chia-Hao Liang, Tu Chen (TW); Hsin-Chang Tsai, Taipei (TW); Xie-Zhi Zhong, Tu Chen (TW)

(73) Assignee: Everlight Electronics Co., Ltd., New Taipei (TW)

( * ) Notice: Subject to any disclaimer, the term of this patent is extended or adjusted under 35 U.S.C. 154(b) by 182 days.

(21) Appl. No.: 12/313,590

(22) Filed: Nov. 21, 2008

(65) Prior Publication Data

US 2009/0134424 A1    May 28, 2009

(30) Foreign Application Priority Data

Nov. 22, 2007  (TW) ................................ 96144339 A

(51) Int. Cl.
*H01L 33/54* (2010.01)
*H01L 33/56* (2010.01)
*H01L 23/043* (2006.01)

(52) U.S. Cl. .......... 257/99; 257/680; 257/692; 257/727; 257/729

(58) Field of Classification Search ............... 257/99, 257/727
See application file for complete search history.

(56) References Cited

U.S. PATENT DOCUMENTS

| | | | |
|---|---|---|---|
| 6,439,897 B1 * | 8/2002 | Ikeya | 439/73 |
| 2006/0220051 A1 * | 10/2006 | Fung et al. | 257/99 |
| 2006/0227509 A1 * | 10/2006 | Yang et al. | 361/704 |
| 2008/0224166 A1 * | 9/2008 | Glovatsky et al. | 257/99 |

FOREIGN PATENT DOCUMENTS

| | | |
|---|---|---|
| CN | 2534679 (A) | 2/2003 |
| CN | 1716646 (A) | 1/2006 |
| CN | 1815764 (A) | 8/2006 |
| CN | 1897262 (A) | 1/2007 |
| JP | 2003101072 (A) | 4/2003 |
| TW | M279021 | 10/2005 |
| TW | M280580 | 11/2005 |
| TW | M308547 | 3/2007 |
| WO | WO2005088191 (A1) | 9/2005 |

* cited by examiner

*Primary Examiner* — Ha Tran T Nguyen
*Assistant Examiner* — Raj R Gupta
(74) *Attorney, Agent, or Firm* — Han IP Law PLLC; Andy M. Han

(57) ABSTRACT

The light emitting structure disclosed includes a light emitting device, a metal frame, and a repressing fastener. The light emitting device has a plurality of first coupling terminals, and the metal frame has a plurality of second coupling portions. The light emitting device is disposed in the metal frame, and the first coupling terminals touch the second coupling portions to electrically connect the light emitting device and the metal frame. The repressing fastener is disposed on the light emitting device and fastened to the metal frame to secure the light emitting device in the metal frame. An LED securing device is also disclosed.

20 Claims, 3 Drawing Sheets

US 8,067,781 B2

LIGHT EMITTING STRUCTURE AND SECURING DEVICE THEREOF

RELATED APPLICATIONS

This application claims priority to Taiwan Application Serial Number 96144339, filed Nov. 22, 2007, which is herein incorporated by reference.

BACKGROUND

1. Field of Invention

The present invention relates to a light emitting structure. More particularly, the present invention relates to a securing device for the light emitting structure.

2. Description of Related Art

Semiconductor light emitting diodes (LED) have become a promising device for general-purpose illumination applications. An LED has excellent durability, a long operation life, low power consumption, contains no mercury and has potentially high efficiency. An LED is an illumination light source that is good for environmental protection and energy saving. The conventional illumination devices such as incandescent bulbs are cheap in price, but, unfortunately, they have drawbacks of low efficiency, high power consumption, short operation life and fragility. The fluorescent lamps are energy saving devices but still fragile, and contain mercury causing environmental pollution problems. Therefore, the LEDs are ideal light sources for general-purpose illumination applications for the new generation.

The conventional LED chips are directly soldered on the printed circuit board in the light emitting structure. However, the LED chip may be heated and damaged by the high temperature of the soldering process. The LED chip must be de-soldered when the LED chip is replaced, and the high temperature of the de-soldering process may damage the components disposed near the LED chip.

For the foregoing reasons, there Is a need to prevent the LED chip from heat damage.

SUMMARY

The invention provides a light emitting structure. The light emitting structure includes a light emitting diode (LED) chip, a metal frame, and a repressing fastener. The LED chip has a plurality of first coupling portions, and the metal frame has a plurality of second coupling portions. The LED chip is disposed in the metal frame, and the first coupling portions touch the second coupling portions to electrically connect the LED chip and the metal frame. The repressing fastener is disposed on the LED chip and fastened to the metal frame to secure the LED chip in the metal frame.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the preferred embodiment, with reference made to the accompanying drawings as follows.

DESCRIPTION OF THE PREFERRED EMBODIMENTS

Figure 1:
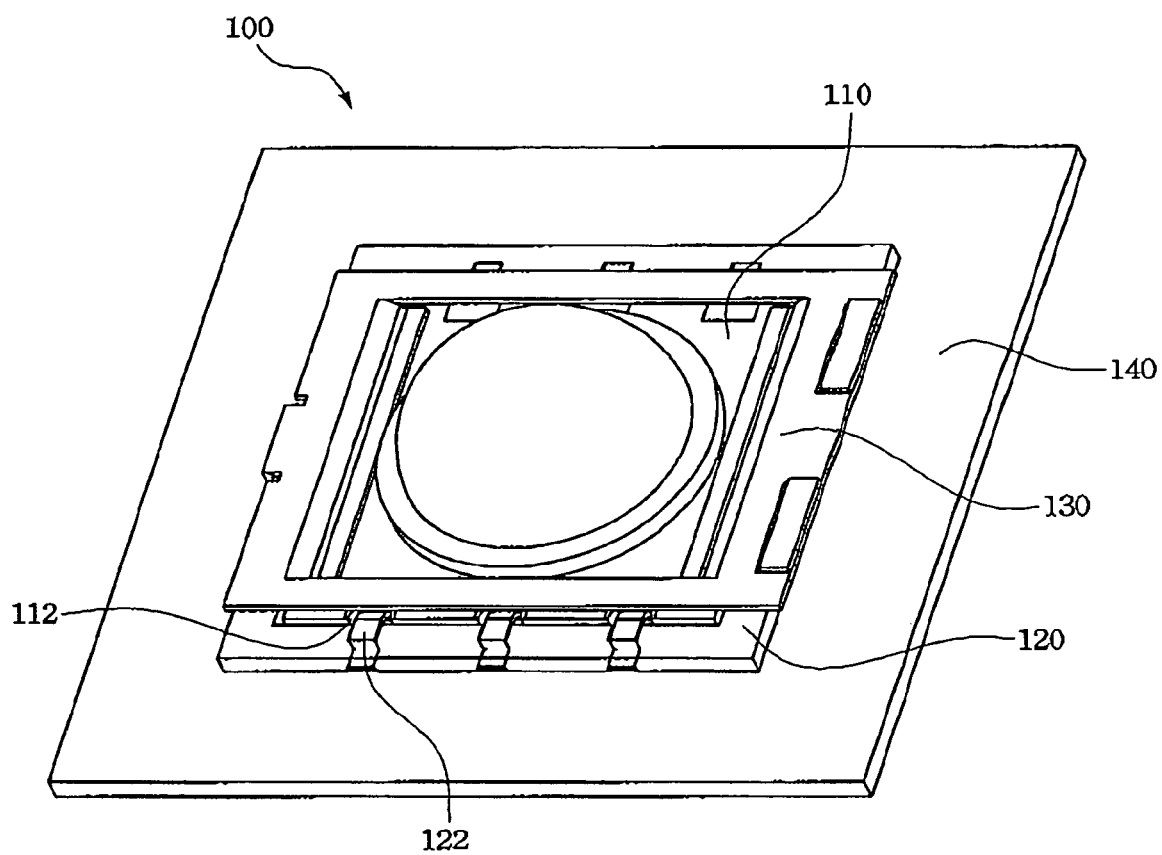
FIG. 1 is an oblique diagram of an embodiment of the light emitting structure of the invention.

Reference will now be made in detail to the present preferred embodiments of the invention, examples of which are illustrated in the accompanying drawings. Wherever possible, the same reference numbers are used in the drawings and the description to refer to the same or like parts.

Refer to FIG. 1. FIG. 1 illustrates an oblique diagram of an embodiment of the light emitting structure of the invention. The light emitting structure 100 Includes a light emitting device 110, a metal frame 120, a repressing fastener 130, and a substrate 140. The metal frame 120 has a hollow cavity for containing the light emitting device 110, and the metal frame 120 Is fixed on the substrate 140. The metal frame 120 may be bonded on the substrate 140. The light emitting device 110 is disposed in the metal frame 120.

The light emitting device 110 has a plurality of first coupling portions 112, and the metal frame 120 has a plurality of second coupling portions 122 disposed corresponding to the first coupling terminals 112. The first coupling terminals 112 touch the second coupling portions 122 to electrically connect to the light emitting device 110 and the metal frame 120. The repressing fastener 130 is disposed on the light emitting device 110 and is fastened to the metal frame 120 to repress and secure the light emitting device 110 in the metal frame 120.

The substrate 140 may be a printed circuit board. The light emitting device 110 may electrically connect to the metal frame 120 by the first coupling terminals 112 and the second coupling portions 122i and the light emitting device may further electrically connect to the substrate 140 through the metal frame 120. The light emitting device 110 may be repressed and secured in the metal frame 120, and the damage of the light emitting device 110 caused by the high temperature during the conventional soldering process may be prevented.

The LED securing device of the light emitting structure 100 includes the metal frame 120 bonded on the substrate 140 and the repressing fastener 140 for securing the light emitting device 110. The metal frame 120 of the LED securing device may be soldered on the substrate 140 previously, and the light emitting device 110 may not be damaged by the high temperature generated in the soldering process, The light emitting device 110 may easily be replaced in this light emitting structure 100 with the LED securing device.

Figure 2:
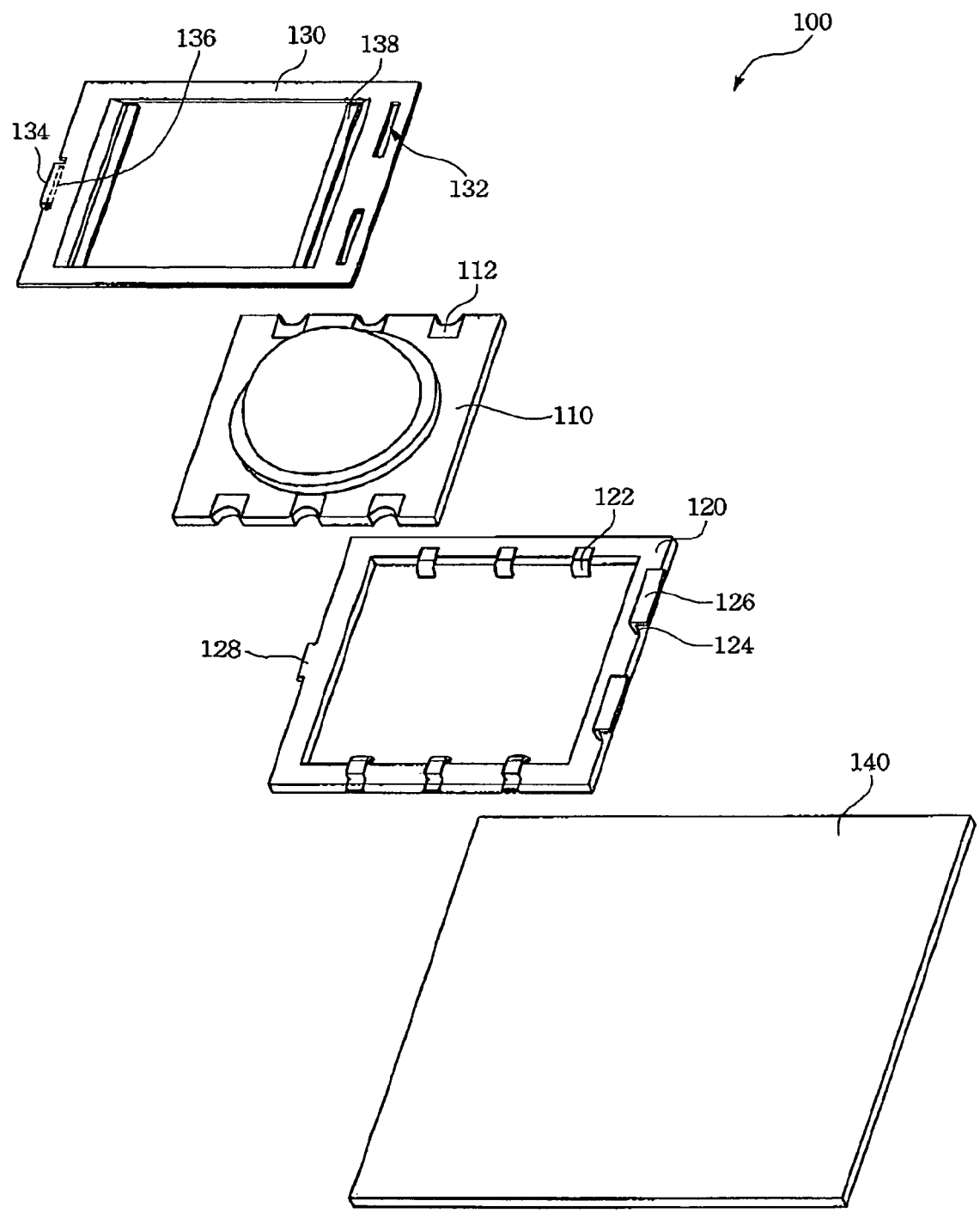
FIG. 2 is an explosion diagram of another embodiment of the light emitting structure of the invention.

Refer to FIG. 2. FIG. 2 illustrates an explosion diagram of another embodiment of the light emitting structure of the invention. There is an extending portion 124 disposed on a side of the metal frame 120, and the extending portion 124 is extending toward the repressing fastener 130. The repressing fastener 130 has a through hole 132 disposed corresponding to the extending portion 124. The extending portion 124 may pass through the through hole 132 to fix the repressing fastener 130 on the metal frame 120. The extending portion 124 may further include a bending portion 126 passing through the through hole 132. The bending portion 126 may hook with the repressing fastener 130 for combining the repressing fastener 130 and the metal frame 120.

The metal frame 120 may have a protrusion 128 protruding from a side of the metal frame 120 opposite the extending portion 124. The repressing fastener 130 may have a buckling portion 134 disposed corresponding to the protrusion 128. The buckling portion 134 may have an opening 136. The protrusion 128 may couple to the opening 136 to fix the repressing fastener 130 to the metal frame 120 after the extending portion 124 passes through the through hole 132.

The shape of the metal frame 120 may be a rectangle. The first coupling terminals 112 may be disposed on two opposite sides of the light emitting device 110. The second coupling portions 122 are disposed on two opposite sides of the metal frame 120 corresponding to the first coupling terminals 112 to touch the first coupling terminals 112. The extending portion 124 and the protrusion 128 are disposed on another two opposite sides of the metal frame 120 respectively. Each first coupling terminal 112 may have a concave surface and each second coupling portion 122 may have a hook-shaped surface. The first coupling terminal 112 may further be pasted with a solder paste to improve the electrical connection of the first coupling terminal 112 and the second coupling portions 122.

The material of the repressing fastener 130 may be a plastic, especially an elastic plastic. The buckling portion 134 can be pulled and released from the protrusion 128, and the repressing fastener 130 can be lifted. Then the light emitting device 110 under the repressing fastener 130 can be easily replaced.

Figure 3:
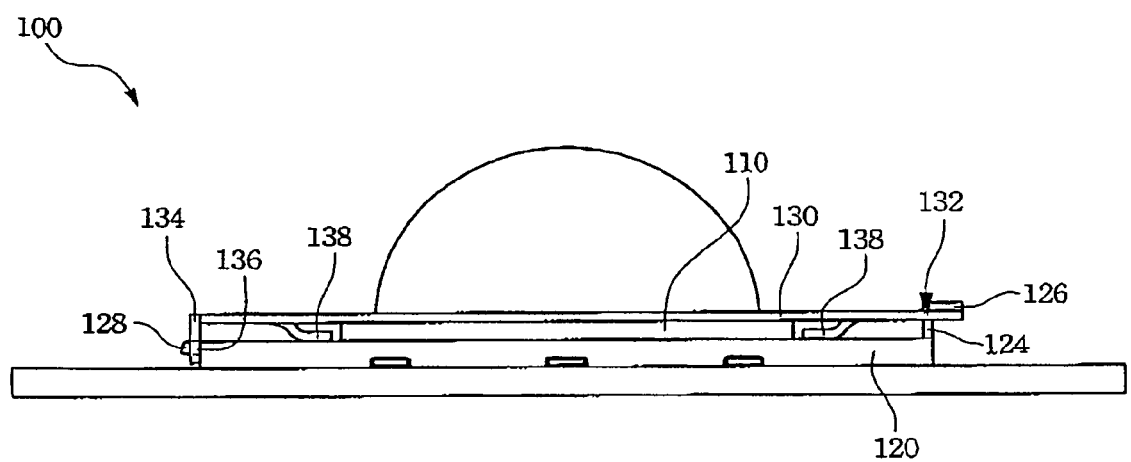
FIG. 3 is a side view diagram of another embodiment of the light emitting diode of the invention.

Refer to FIG. 3. FIG. 3 illustrates a side-view diagram of another embodiment of the light emitting structure of the invention. The extending portion 124 of the metal frame 120 may pass through the through hole 132 of the repressing fastener 130, and the repressing fastener 130 may hook with the metal frame 120 by the bending portion 126. The protrusion 128 of the metal frame 120 may couple to the opening 136 of the buckling portion 134 of the repressing fastener 130. The pressing fastener 130 is fastened to the metal frame 120 to secure the light emitting device 110 in the metal frame 120.

The repressing fastener 130 may have a plurality of elastic pieces 138 surrounding and extending to the light emitting device 110. The elastic pieces 138 may touch the light emitting device 110 and repress the light emitting device 110 to secure the light emitting device 110 in the metal frame 120. The elastic pieces 138 with elasticity secure the light emitting device 110 stably.

The light emitting structure and the securing device thereof may have following advantages. The metal frame of the LED securing device may be soldered on the substrate previously, thus the LED chip may not be damaged by the high temperature generated in the soldering process. The LED chip can electrically connect to the printed circuit board through the metal base. The LED chip may easily be replaced in this light emitting structure with the LED securing device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting structure comprising:
   a substrate;
   a light emitting device comprising a plurality of first coupling terminals;
   a metal frame disposed on the substrate and comprising a plurality of second coupling portions, the light emitting device disposed in the metal frame with the first coupling terminals touching the second coupling portions such that the light emitting device is electrically connected to the substrate via the plurality of first coupling terminals touching the plurality of second coupling portions; and
   a repressing fastener disposed on the light emitting device and fastened to the metal frame for securing the light emitting device in the metal frame.

2. The light emitting structure of claim 1, wherein the first coupling terminals are disposed on two opposite sides of the LED chip, and the second coupling portions are disposed corresponding to the first coupling terminals.

3. The light emitting structure of claim 1, wherein each first coupling terminal has a concave surface, and each second coupling portion has a hooked-shaped surface.

4. The light emitting structure of claim 1, wherein the repressing fastener comprises a plurality of elastic pieces extending to the light emitting device and touching the light emitting device for securing the light emitting device on the metal frame.

5. The light emitting structure of claim 1, wherein the substrate comprises a printed circuit board bonding with the metal frame.

6. The light emitting structure of claim 1, wherein the repressing fastener comprises a first through hole formed in a first side of the repressing fastener, and the metal frame comprises a first extending potion extending toward the repressing fastener and passing through the first through hole.

7. The light emitting structure of claim 6, wherein the first extending portion comprises a bending portion passes through the first through hole and hooks with the repressing fastener to combine the repressing fastener and the metal frame.

8. The light emitting structure of claim 6, wherein the repressing fastener comprises a buckling portion having an opening and formed in a second side opposite to the first through hole, and the metal frame comprises a protrusion to couple to the opening.

9. The light emitting structure of claim 6, wherein the light emitting device defines a side with more than one of the first coupling terminals disposed thereon in a first direction, wherein the metal frame defines a side with more than one of the second coupling portions disposed thereon in generally the same direction as the first direction, wherein the repressing fastener comprises a second through hole formed in the first side of the repressing fastener, and the metal frame comprises a second extending potion extending toward the repressing fastener and passing through the second through hole, wherein the first and the second through holes are aligned in the first side in a second direction that is different from the first direction.

10. A light emitting diode (LED) securing device for securing a light emitting device on a substrate, the LED securing device comprising:
    a metal frame fixed on the substrate for containing the light emitting device within, the metal frame having a plurality of second coupling portions in direct contact with a plurality of first coupling terminals of the light emitting device to electrically connect the light emitting device and the substrate via the plurality of second coupling portions and the plurality of first coupling terminals; and
    a repressing fastener disposed on the light emitting device and fastened to the metal frame for securing the light emitting device in the metal frame.

11. The LED securing device of claim 10, wherein the first coupling terminals are disposed on two opposite sides of the light emitting device, and the second coupling portions are disposed corresponding to the first coupling terminals.

12. The LED securing device of claim 10, wherein each first coupling terminal has a concave surface, and each second coupling portion has a hook-shaped surface.

13. The LED securing device of claim 10, wherein the repressing fastener comprises a plurality of elastic pieces extending to the light emitting device and touching the light emitting device for securing the light emitting device on the metal frame.

14. The LED securing device of claim 10, wherein the repressing fastener comprises a first through hole formed in a first side of the repressing fastener, and the metal frame comprises a first extending potion extending toward the repressing fastener and passing through the first through hole.

15. The LED securing device of claim 14, wherein the first extending portion comprises a bending portion passes through the first through hole and hooks with the repressing fastener to combine the repressing fastener and the metal frame.

16. The LED securing device of claim 14, wherein the repressing fastener comprises a buckling portion having an opening and formed in a second side opposite to the first through hole, and the metal frame comprises a protrusion to couple to the opening.

17. The LED securing device of claim 14, wherein the light emitting device defines a side with more than one of the first coupling terminals disposed thereon in a first direction, wherein the metal frame defines a side with more than one of the second coupling portions disposed thereon in generally the same direction as the first direction, wherein the repressing fastener comprises a second through hole formed in the first side of the repressing fastener, and the metal frame comprises a second extending potion extending toward the repressing fastener and passing through the second through hole, wherein the first and the second through holes are aligned in the first side in a second direction that is different from the first direction.

18. A light emitting structure comprising:
a substrate having a first surface;
a light emitting device disposed above the first surface of the substrate and comprising a plurality of first coupling terminals;
a metal frame disposed on the first surface of the substrate and defining an opening having the light emitting device received therein, the metal frame comprising a plurality of second coupling portions touching the plurality of first coupling portions; and
a repressing fastener disposed on the light emitting device and fastened to the metal frame for securing the light emitting device in the metal frame.

19. The light emitting structure of claim 18, wherein the substrate is electrically connected to the light emitting device through the second coupling portions touching the plurality of first coupling portions.

20. The light emitting structure of claim 18, wherein the substrate has an outer edge defining a first outer periphery, wherein the metal frame has an outer edge defining a second outer periphery, and wherein the first outer periphery of the substrate encompasses the second outer periphery of the metal frame.

* * * * *